US008273146B1

(12) United States Patent
Maruyama et al.

(10) Patent No.: US 8,273,146 B1
(45) Date of Patent: Sep. 25, 2012

(54) WAFER AND EPITAXIAL WAFER, AND MANUFACTURING PROCESSES THEREFOR

(75) Inventors: Fumiaki Maruyama, Gunma (JP); Naoki Naito, Fukushima (JP); Atsuo Uchiyama, Kosyoku (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 2935 days.

(21) Appl. No.: 09/856,139

(22) PCT Filed: Sep. 20, 2000

(86) PCT No.: PCT/JP00/06406
§ 371 (c)(1),
(2), (4) Date: May 29, 2001

(87) PCT Pub. No.: WO01/23649
PCT Pub. Date: Apr. 5, 2001

(30) Foreign Application Priority Data

Sep. 29, 1999 (JP) ...................................... 11-277255

(51) Int. Cl.
*B08B 15/02* (2006.01)
*B01D 46/00* (2006.01)
(52) U.S. Cl. ........... 55/486; 55/385.2; 438/455; 501/35; 501/70
(58) Field of Classification Search .................... 55/502, 55/504, 385.2, 486; 438/455; 501/35, 70
See application file for complete search history.

(56) References Cited

U.S. PATENT DOCUMENTS 5,804,494 A * 9/1998 Mitani et al. .................. 438/455
5,997,598 A * 12/1999 Kobayashi et al. ............. 55/502
6,102,977 A * 8/2000 Johnson ....................... 55/385.2

OTHER PUBLICATIONS

Abstract of Japanese Patent Publication No. 05259147A; dated Oct. 8, 1993.
Abstract of Japanese Patent Publication No. 2000300919A; dated Oct. 31, 2000.
Abstract of Japanese Patent Publication No. 10308373A; dated Nov. 17, 1998.
Takao Okada, "Kouseinou Filter ni okeru Boron Osen Taisaku," Kuuki Seijou, vol. 36, No. 6, Mar. 31, 1999 (Tokyo), pp. 403-406.

* cited by examiner

*Primary Examiner* — Anh Mai
(74) *Attorney, Agent, or Firm* — Carl Schaukowitch; Rader, Fishman & Grauer, PLLC

(57) ABSTRACT

Provided is a silicon wafer which is stabilized in quality exerting no adverse influence on device characteristics and manufactured by restricting a boron contamination from the environment, and a manufacturing process therefor. Concretely, the silicon wafer is characterized by an attached boron amount thereon being $1\times10^{10}$ atoms/cm$^2$ or less. In order to manufacture such a wafer as contains a small amount of boron attached on the wafer surface, the wafer is treated in an atmosphere of boron concentration of 15 ng/m$^3$ or less. Boron-less filters and boron adsorbing filters are used as filters in a clean room and the like so as to lower the boron concentration in the atmosphere.

11 Claims, 13 Drawing Sheets

FIG. 2
(a)
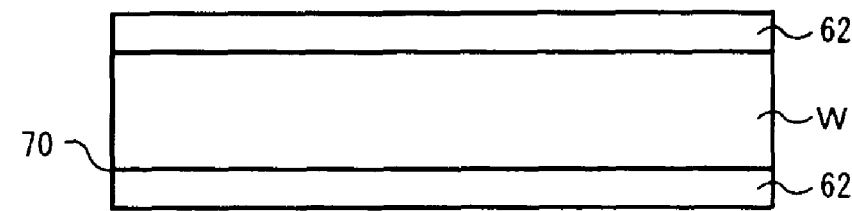
(b)
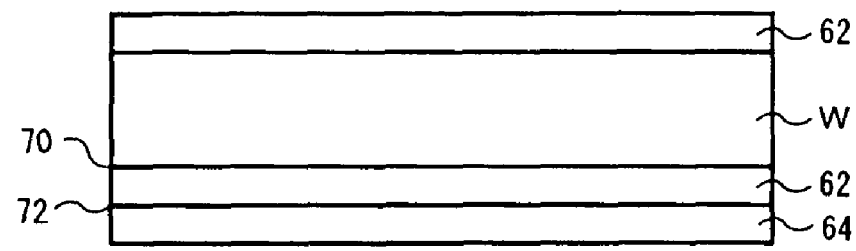
(c)
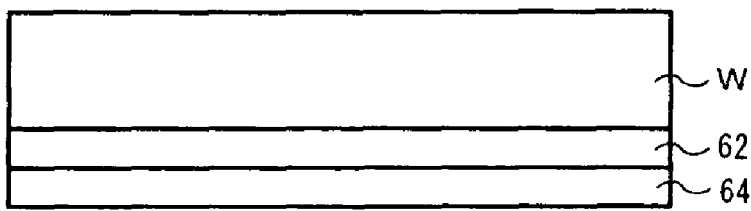
(d)
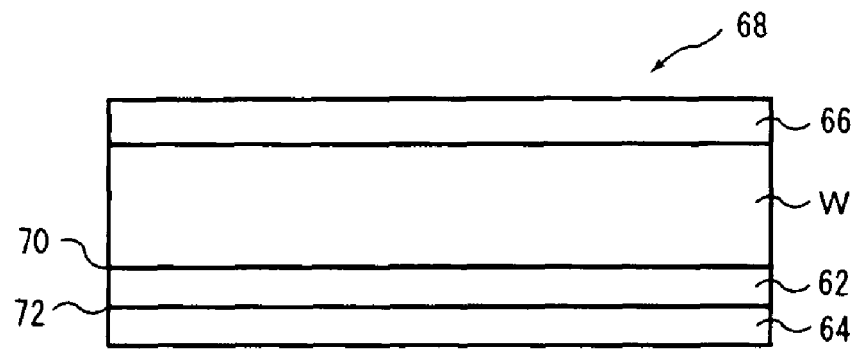
(e)

WAFER AND EPITAXIAL WAFER, AND MANUFACTURING PROCESSES THEREFOR

TECHNICAL FIELD

This invention relates to a silicon wafer and an epitaxial wafer, both stabilized in quality, and manufacturing processes therefor, and air conditioning facilities for a clean room.

BACKGROUND ART

Electric characteristics of a silicon wafer as a starting material are altered by impurity elements included in the silicon wafer and attached thereto during heat treatment of a device fabrication process, which cause device failure; therefore, to avoid such an adverse influence due to impurities has been more and more important with the advent of highly sophisticated devices and become a great problem to be solved in the device fabrication as well.

As one measure against the adverse influence, a method has been put into practice in which a polycrystal silicon layer (PBS, Poly Back Seal, film) 62 is formed on a back surface of a silicon wafer W as shown in FIG. 10 as well as grain boundaries present in the PBS film are utilized as an absorption source for the impurities, and a wafer and an epitaxial wafer both with a so-called PBS film on a back surface thereof have been utilized as products.

Especially, boron among the IIIB group elements is positively utilized in order to impart a P type conductivity to silicon and adjust a conductivity thereof to a prescribed value, whereas on the other hand, boron attached on a silicon wafer coming from an atmosphere in which the silicon wafer is handled, and an apparatus, materials and others used in processing steps acts as an extrinsic factor to disturb electric characteristics of the wafer; therefore, it is required to prevent contamination due to boron from the atmosphere, apparatus, materials and others as much as possible.

Assume that boron is attached on a silicon wafer surface at a concentration of $1 \times 10^{10}$ atoms/cm$^2$ and diffused into the interior from the surface (on the order of 1 µm in depth), this diffusion corresponds to several ohm·cm in electric resistivity of the surface layer; therefore, electric characteristics of the surface layer, in which devices are fabricated, would be considerably affected with a variation if a bulk electric resistivity of the wafer is 1 ohm·cm or higher.

Furthermore, in cases of a wafer with a PBS film and an epitaxial wafer with a PBS film, boron attached on a wafer surface on which a PBS film is to be formed diffuses mainly into the PBS film in heat treatment of a PBS film forming process and an epitaxial layer growing process following the PBS film forming process. Moreover, when boron is attached on a substrate surface on which an epitaxial layer is to be grown, the element diffuses into the interior of the substrate and the epitaxial layer from the interface therebetween by heating during growth of the layer. This may cause a trouble that a device fabricated using an epitaxial wafer whose substrate has an electric resistivity of several ohm·cm or higher cannot achieve prescribed characteristics thereof.

Furthermore, when an epitaxial layer is grown in manufacture of an epitaxial wafer, a PBS film on the back surface results in a non-uniform film thickness and surface roughening in a wafer periphery thereof due to etching with an atmospheric constituent gas in a growth chamber. For the purpose to prevent such inconveniences, a silicon oxide film (CVD silicon oxide film) has been further formed on the PBS film by means of a CVD (Chemical Vapor Deposition) method, but if boron contamination occurs in this CVD process similar to the above described as well, attached boron diffuses mainly into the PBS film by temperature increase in the CVD process and the following epitaxial layer growing process, which exerts an adverse influence on the device characteristics as in the above described.

Concrete description will be given of the prior art problem described above with respect to a case of an epitaxial wafer with a PBS film as an example. FIG. 10 is a descriptive diagram showing a prior art manufacturing process for an epitaxial wafer with a PBS film, wherein (a) shows a silicon wafer W, (b) a state after a polycrystal silicon layer 62 is formed on the silicon wafer W, (c) a state after a CVD silicon oxide film 64 is further formed on the polycrystal silicon layer (PBS film) 62 on the back surface of the silicon wafer of (b) in order to prevent the above described etching in the following epitaxial layer growing step, (d) a state after the polycrystal silicon layer 62 on the front surface of the silicon wafer is removed by mirror polishing, and (e) a state after an epitaxial layer 66 is formed on the front surface of the silicon wafer following the state of (d).

In manufacture of the epitaxial wafer with a PBS film on a back surface thereof according to a prior art, boron is attached at the interface 70 between the silicon wafer W and the polycrystal silicon layer (PBS film) 62, which causes contamination (FIG. 10(b)). Then, boron contamination occurs at the interface 72 between the polycrystal silicon layer 62 and the CVD film 64 (FIG. 10(c)). After the polycrystal silicon layer 62 on the silicon wafer W is removed (FIG. 10(d)), an epitaxial layer growing step (high temperature heat treatment) is applied and thereby boron present at the interfaces 70 and 72 diffuses into the PBS film 62 and further contaminates the PBS film in the entirety thereof to produce the boron-contaminated PBS film 62a (FIG. 10(e)).

On the other hand, in a clean room (containing a cleaning apparatus, a wafer storage box, a film growing apparatus and so on) or the like where prior art treatments of a semiconductor wafer, for example cleaning, transportation, storage, film growth and others are performed, there has been no knowledge of how much boron included in an atmosphere with which a wafer is in contact is attached onto a surface of the wafer. Accordingly, there has been absolutely no knowledge of a value or less at which if a boron concentration in the atmosphere with which the wafer is in contact is controlled, a boron amount attached on the wafer from the atmosphere can be restricted to a value or less at which neither of device characteristics are adversely affected in any way, which has made effective prevention of boron contamination in manufacture of a high quality wafer difficult in a practical aspect. That is, since it takes much of time for measurement of a boron amount attached on a wafer in process, a result of the measurement cannot be immediately fed back on the spot to the apparatus side; therefore, it has been impossible to perform on-line control for prevention of boron contamination. Hence, it has been impossible to manufacture a wafer stabilized in quality as far as control for prevention of boron contamination is effected based on measurement of a boron amount on a wafer.

Besides, air filters used in a clean room (containing a cleaning apparatus, a wafer storage box, a film growth apparatus and so on) or the like where prior art treatment of a semiconductor wafer, for example cleaning, transportation, storage, film growth and others is performed are generally made from glass fibers; therefore, it is known that if a corrosive gas such as hydrogen fluoride is present in an atmosphere when a wafer is treated, the gas is put into contact with the glass fibers to dissolve boron therein out into the atmosphere.

As air conditioning facilities for a clean room, a construction as shown in FIG. 11 has been adopted. In FIG. 11, 12 indicates air conditioning facilities constituting a clean room 14 and in the clean room 14, provided are various kinds of wafer treatment rooms such as, in a case shown in the figure, a CVD treatment room 16, a CVD furnace room 18, a PBS film forming room 20 and a PBS furnace room 22. One or more air inlet ports are provided in each of the rooms 16, 18, 20 and 22, and air filters 16a, 16b, 18a, 20a, 20b and 22a are equipped to the respective air inlet ports.

Various kinds of wafer treatment apparatuses are installed in the respective wafer treatment rooms. For example, in the CVD treatment room 16 disposed are a CVD treatment precleaner 24, a dryer 26 and a storage clean booth 28. In the CVD furnace room 18, a CVD furnace 30 is disposed. In the PBS film forming room 20, disposed are a PBS film formation precleaner 32, a dryer 34 and a storage clean booth 36. In the PBS furnace room 22, a PBS apparatus 38 is disposed. Air filters 24a, 26a, 28a, 30a, 32a, 34a, 36a and 38a are mounted to air inlet ports of the apparatuses 24, 26, 28, 30, 32, 34, 36 and 38. A numerical mark 39 indicates an air outlet space disposed on the downstream side of the clean room 14. The air outlet space 39 is connected to a recovery pipe 43.

An outdoor air cleaner 40, an impurity removal apparatus 42 and an air conditioner 44 are in series disposed along a direction from upstream to downstream on the upstream side of the clean room 14. The outdoor air cleaner 40 and the impurity removal apparatus 42 are connected to each other by a first air pipe 46 and the impurity removal apparatus 42 and the air conditioner 44 are connected to each other by a second air pipe 48. A third air pipe 50 connects the air conditioner 44 with each of the air filters 16a, 16b, 18a, 20a, 20b and 22a mounted at the air inlet ports of the respective rooms of the clean room 14.

The outdoor air cleaner 40 includes a roll filter 99 and a medium-performance filter 52, both of which are disposed at the air inlet side, and a fan 54 at the air outlet side. The impurity removal apparatus 42 is constituted of a chemical filter for removing NOx and SOx. The air conditioner 44 includes an air inlet fan 56 and a prefilter 98 in this order and subsequent to this a medium-performance filter 58 at the air outlet side.

In the prior art clean room air conditioning facilities 12 having the above described construction, the outside air passes through the outdoor air cleaner 40, the impurity removal apparatus 42 and the air conditioner 44 and is then supplied into the interior of the CVD treatment room 16, the CVD furnace room 18, the PBS film forming room 20 and the PBS furnace room 22 through the respective air filters 16a, 16b, 18a, 20a, 20b and 22a. While, generally speaking, CVD treatment is in that one or more kinds of chemical compound gases or single element gases including element or elements constituting a thin film material are supplied onto a wafer to form a desired thin film on a wafer surface by a chemical reaction in a vapor phase or on the surface, for example, silicon oxide is vapor deposited on a wafer back-surface on which a PBS film is formed in advance, which can be adopted as treatment to prevent etching of a PBS film and auto-doping from occurring.

Air introduced into the rooms is further introduced into the cleaner 24 through the air filter 24a, into the dryer 26 through the air filter 26a, into the storage clean booth 28 through the air filter 28a, into the CVD apparatus 30 through the air filter 30a, into the PBS precleaner 32 through the air filter 32a, into the dryer 34 through the air filter 34a, into the storage clean booth 36 through the air filter 36a, and into the PBS apparatus 38 through the air filter 38a; and finally discharged into the air outlet space 39, wherein the air is partly discharged directly from the cleaners 24 and 32, and all the air provided is discharged directly from the CVD apparatus 30. The air discharged into the air outlet space 39 amounts to about 80% of the total supply and is recycled after being returned to the second air pipe 48 through the recovery pipe 43.

In such a prior art clean room air conditioning facilities, ULPA filters (for example, Nippon Muki Co., Ltd. NMO-320) are generally employed as the air filters 16a, 16b, 18a, 20a, 20b, 22a, 24a, 26a, 28a, 30a, 32a, 34a, 36a and 38a. This ULPA filter has no function to remove boron, but on the contrary, has a risk to release boron either. Furthermore, the medium-performance filters 52 and 58 (for example, Nippon Muki Co., Ltd. ASTC-56-95) has no function to remove boron either, but on the contrary, has a risk to release boron. Hence, control of a boron concentration in an atmosphere of a clean room absolutely cannot be effected with prior art air conditioning facilities in which such filters are incorporated.

Moreover, while a boron-less filter (an air filter from which no boron is released) and a boron adsorbing filter (a filter which adsorbs boron therein) are known, it is a current state of the art that no proposal on a good method has been made in which these filters are efficiently utilized to suppress an attached amount of boron on a wafer to a prescribed value or less. There is available a reference in which an adverse influence of boron in an atmosphere of a clean room on manufacture of a bonding-type substrate is discussed, in which while only difficulty in realization of removing facilities in a practical use is pointed out (for example, JP-2723787), discussion is presented about neither effective removal of boron nor control of a boron content in an atmosphere of a clean room within a prescribed range.

In order to solve the above described problems associated with a wafer and an epitaxial wafer, the inventors have quantitatively determined a relationship between a boron concentration in an atmosphere with which the wafer and the epitaxial wafer are in contact and a boron amount attached onto a surface of each of the wafers placed in the atmosphere and have further empirically made clear an influence of an attached boron amount on boron concentration distributions in the bulks of various products, and based on such knowledge and findings, have finally succeeded in restricting boron contamination coming from the environment and besides manufacturing the wafer and the epitaxial wafer causing no adverse influence on device characteristics therefrom in a stable manner.

It is accordingly a first object of the invention to provide a silicon wafer and an epitaxial wafer, both stabilized in quality, which exert no adverse influence on device characteristics, manufactured by restricting a boron contamination from the environment; and effective manufacturing processes therefor.

In order to solve the above described problems of prior art clean room air conditioning facilities, the inventors further continued to conduct serious studies on a relationship between a boron concentration in an atmosphere and an attached boron concentration on a wafer, by performing experiments in which the air in a clean room (containing a cleaner, a wafer storage box, a film growing apparatus and so on) was dissolved into pure water in an impinger and the pure water after the dissolution was analyzed by ICP-MS (Inductively Coupled Plasma Mass Spectrometry) to measure a boron concentration in the atmosphere, with the result that the inventors have succeeded in not only discovering that there is a relationship between a boron concentration in an atmosphere and an attached boron concentration on a wafer, but also suppressing the boron concentration in an atmosphere of a clean room to a prescribed concentration or less.

It is a second object of the invention to provide an atmosphere control apparatus, a clean room and clean room air conditioning facilities capable of preventing boron contamination on a wafer at low cost.

DISCLOSURE OF THE INVENTION

In order to achieve the first object, a first aspect of a silicon wafer of the invention is characterized in that an attached boron amount on a surface of the silicon wafer is $1\times10^{10}$ atoms/cm$^2$ or less.

A second aspect of a silicon wafer of the invention is characterized in that an increment of a boron concentration in a surface layer down to a depth 0.5 μm relative to a boron concentration in bulk silicon direct beneath the surface layer is $1\times10^{15}$ atoms/cm$^3$ or less.

A third aspect of a silicon wafer of the invention is characterized in that the silicon wafer has a polycrystal silicon layer on one of major surfaces thereof and an increment of a boron concentration in an adjacent layer of a thickness of 1 μm adjacent to and including an interface between the polysilicon layer and a single crystal silicon layer relative to a boron concentration in silicon in external contact with the adjacent layer is $1\times10^{15}$ cm$^3$ or less.

A first aspect of a silicon epitaxial wafer of the invention is characterized in that the silicon epitaxial wafer has a structure in which a polycrystal silicon layer is provided on a back surface of a single crystal silicon substrate and an increment of a boron concentration in an adjacent layer of a thickness of 1 μm adjacent to and including an interface between single crystal silicon of the substrate and the polycrystal silicon layer relative to a boron concentration in silicon of the substrate in external contact with the adjacent layer is $1\times10^{15}$ atoms/cm$^3$ or less.

A fourth aspect of a silicon wafer of the invention is characterized in that the silicon wafer has a structure in which a CVD silicon oxide film is provided on one of major surfaces thereof and an increment of a boron concentration in an adjacent layer of a thickness within 0.5 μm of an interface between the CVD silicon oxide film and a single crystal silicon layer relative to a boron concentration in bulk silicon in contact with the adjacent layer is $1\times10^{15}$ atoms/cm$^3$ or less.

A second aspect of a silicon epitaxial wafer of the invention is characterized in that the silicon epitaxial wafer has a structure in which a CVD silicon oxide film is provided on a back surface of a single crystal silicon substrate and an increment of a boron concentration in a substrate single crystal silicon adjacent layer of a thickness within 0.5 μm of an interface between the CVD silicon oxide film and the substrate relative to a boron concentration in silicon of the substrate in contact with the adjacent layer is $1\times10^{15}$ atoms/cm$^3$ or less.

In the above described silicon epitaxial wafer, boron contamination from the environment is effectively suppressed and a boron concentration in a polycrystal layer is preferably $5\times10^{14}$ atoms/cm$^3$ or less, more preferably $3\times10^{14}$ atoms/cm$^3$ or less and most preferably $1\times10^{14}$ atoms/cm$^3$ or less.

A fifth aspect of a silicon wafer of the invention is characterized in that the silicon wafer has a structure in which a polycrystal silicon layer is provided on one major surface of a single crystal silicon layer and a CVD silicon oxide film is further provided on the polycrystal silicon layer, and an increment of a boron concentration in the first adjacent layer of a thickness of 1 μm adjacent to and including an interface between the polycrystal silicon and the single crystal silicon layer relative to a boron concentration in silicon in external contact with the first adjacent layer is $1\times10^{15}$ atoms/cm$^3$ or less and an increment of a boron concentration in a polycrystal silicon adjacent layer of a thickness of 0.5 μm adjacent to and including an interface between the CVD silicon oxide film and the polycrystal silicon layer relative to a boron concentration in polycrystal silicon in external contact with the polycrystal silicon adjacent layer is $1\times10^{15}$ atoms/cm$^3$ or less.

A third aspect of a silicon epitaxial wafer of the invention is characterized in that the silicon epitaxial wafer has a structure in which a polycrystal silicon layer is provided on a back surface of a substrate and a CVD silicon oxide film is further provided on the polycrystal silicon layer, and an increment of a boron concentration in the second adjacent layer of a thickness of 1 μm adjacent to and including an interface between the polycrystal silicon layer and a single crystal silicon layer relative to a boron concentration in silicon in external contact with the second adjacent layer is $1\times10^{15}$ atoms/cm$^3$ or less and an increment of a boron concentration in a polycrystal silicon adjacent layer of a thickness of 0.5 μm adjacent to and including an interface between the CVD silicon oxide film and the polycrystal silicon layer relative to a boron concentration in polycrystal silicon in external contact with the polycrystal silicon adjacent layer is $1\times10^{15}$ atoms/cm$^3$ or less.

The above described aspects of a silicon wafer of the invention are especially effective for a product in which a boron concentration in the single crystal silicon bulk is $1\times10^{16}$ atoms/cm$^3$ or less.

The above described aspects of a silicon epitaxial wafer of the invention are especially effective for a product in which a boron concentration in the substrate is $1\times10^{16}$ atoms/cm$^3$ or less.

A first aspect of a manufacturing process for a silicon wafer of the invention is characterized in that in manufacture of the above described silicon wafer, the silicon wafer in process receives handling such as treatment and storage in an atmosphere of a boron concentration of 15 ng/m$^3$ or less.

A first aspect of a manufacturing process for a silicon epitaxial wafer of the invention is characterized in that in manufacture of the above described silicon epitaxial wafer, the silicon epitaxial wafer in process receives handling such as treatment and storage in an atmosphere of a boron concentration of 15 ng/m$^3$ or less.

A second aspect of a manufacturing process for a silicon wafer of the invention is characterized in that in manufacture of the above described silicon wafer, formation of a polycrystal silicon layer is performed in an atmosphere of a boron concentration of 15 ng/m$^3$ or less.

A second aspect of a manufacturing process for a silicon epitaxial wafer of the invention is characterized in that in manufacture of the above described silicon epitaxial wafer, formation of a polycrystal silicon layer is performed in an atmosphere of a boron concentration of 15 ng/m$^3$ or less.

A third aspect of a manufacturing process for a silicon wafer of the invention is characterized in that in manufacture of the above described silicon wafer, formation of a CVD silicon oxide film is performed in an atmosphere of a boron concentration of 15 ng/m$^3$ or less.

A third aspect of a manufacturing process for a silicon epitaxial wafer of the present invention is characterized in that in manufacture of the above described silicon epitaxial wafer, formation of a CVD silicon oxide film is performed in an atmosphere of a boron concentration of 15 ng/m$^3$ or less.

A fourth aspect of a manufacturing process for a silicon wafer of the invention is characterized in that in manufacture of the above described silicon wafer, a polycrystal layer is formed on a surface on which an attached boron amount is suppressed to $1\times10^{10}$ atoms/cm$^2$ or less.

A fourth aspect of a manufacturing process for a silicon epitaxial wafer of the invention is characterized in that in manufacture of the above described silicon epitaxial wafer, a polycrystal layer is formed on a surface on which an attached boron amount is suppressed to $1\times10^{10}$ atoms/cm$^2$ or less.

An atmosphere control apparatus of the invention is characterized in that the atmosphere control apparatus controls a boron concentration in an atmosphere to be 15 ng/m$^3$ or less.

A clean room of the invention is characterized in that a boron concentration in an atmosphere of the clean room is 15 ng/m$^3$ or less.

Clean room air conditioning facilities of the invention comprise: an air conditioner having a boron-less filter and a boron adsorbing filter; and one or more of wafer treatment apparatuses each having a boron-less filter, wherein an atmosphere gas is recycled between the air conditioner and the clean room or the one or more wafer treatment apparatuses.

In the above described clean room air conditioning facilities, an outdoor air cleaner having a boron-less filter and a boron adsorbing filter is preferably provided.

In the above described clean room air conditioning facilities, it is preferable that an internal pressure of a wafer treatment apparatus is adjusted to be higher than a clean room internal pressure and the clean room internal pressure is adjusted to be higher than an external pressure, wherein the external pressure is a pressure in a service room adjacent to the clean room (a room in which an operator changes clothes or which is employed for incoming or outgoing of a product) or a pressure in a corridor, and is sometimes called the outside air pressure.

A manufacturing process for a wafer of the invention is characterized in that manufacture of the above described wafer is performed using the above described clean room air conditioning facilities.

BRIEF DESCRIPTION OF THE DRAWINGS

FIG. 2 is a descriptive diagram showing manufacturing processes for a silicon wafer and a silicon epitaxial wafer, wherein (a) shows a silicon wafer, (b) a state after a polycrystal silicon layer is formed on the silicon wafer, (c) a state after a CVD silicon oxide film is further formed on the polycrystal silicon layer (PBS film) on the back surface of the silicon wafer of (b), (d) a state after the polycrystal silicon layer on the front surface of the silicon wafer is removed, and (e) a state after an epitaxial layer is formed on the front surface of the silicon wafer following the state of (d);

BEST MODE FOR CARRYING OUT THE INVENTION

Description will be given of an embodiment of the invention based on FIGS. 1 to 3 among the accompanying drawings. The embodiment is shown by way of illustration and needless to say that various modifications or alterations thereof can be possible as far as not departing from the conception of the invention.

Figure 1:
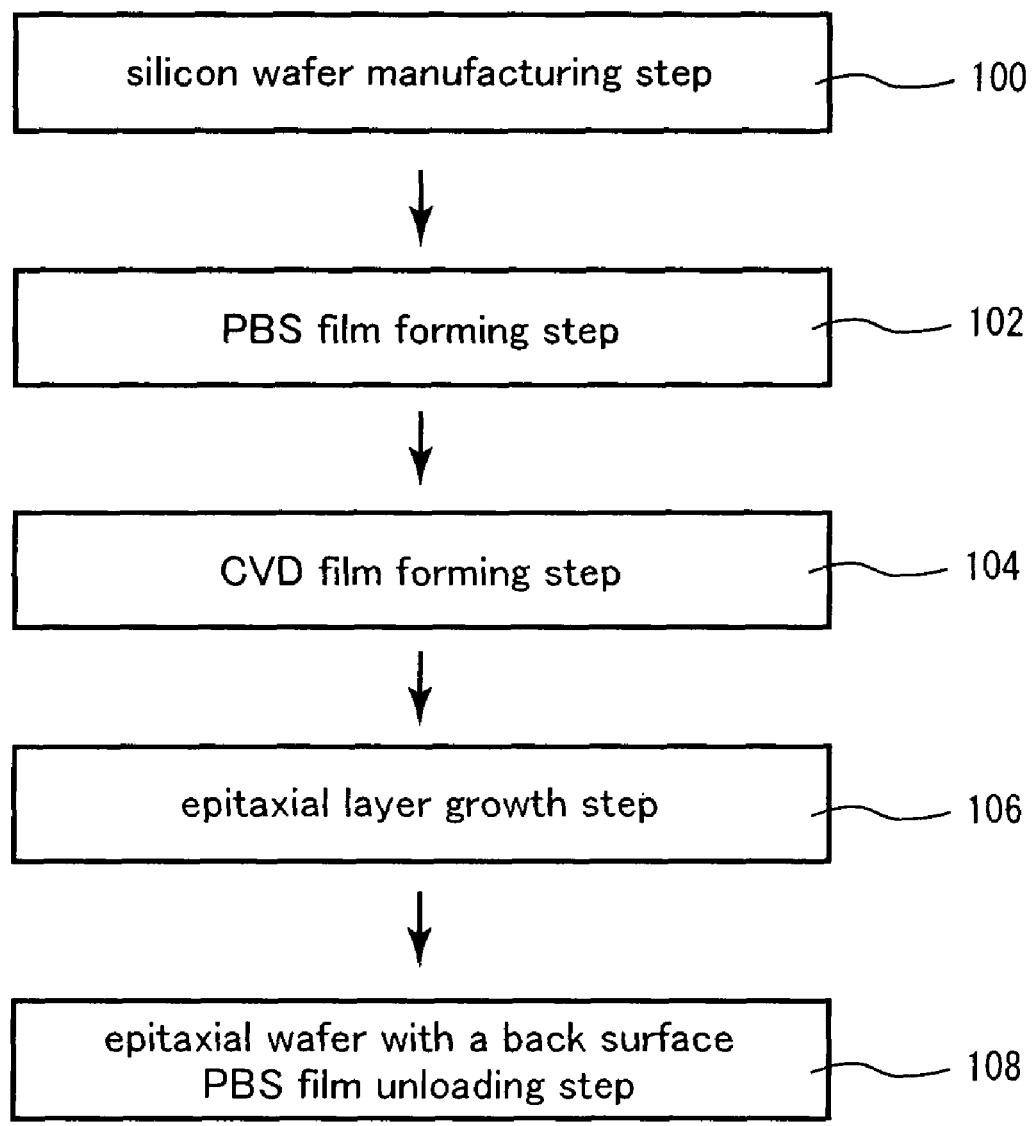
FIG. 1 is a flow chart showing manufacturing processes for a silicon wafer and a silicon epitaxial wafer.

FIG. 1 is a flow chart showing a manufacturing process as one example for a silicon epitaxial wafer with a PBS film on a back surface thereof and FIG. 2 is a descriptive diagram showing a manufacturing process for a silicon epitaxial wafer.

In FIG. 1, 100 indicates a manufacturing step for a silicon wafer, which is a substrate for an epitaxial wafer, where a silicon single crystal ingot is processed according to a standard process including slicing, chamfering, lapping, etching, annealing and others to manufacture a silicon wafer W.

A silicon wafer W can be taken out at this stage from the process if desired and the taken-out silicon wafer W can also be further mirror polished on one surface or both surfaces thereof to achieve a mirror polished silicon wafer. In the invention, cleaning, drying and storage (packaging) steps are performed in a clean room with an atmosphere of a very low boron concentration of 15 ng/m$^3$ or less, which will be described later, and thereby, obtained is a silicon wafer with almost no boron contamination such that an attached boron amount on a wafer surface is $1\times10^{10}$ atoms/cm$^2$ or less, or that an increment of a boron concentration in a surface layer down to 0.5 µm in depth relative to a boron concentration in bulk silicon directly beneath the surface layer is $1\times10^{15}$ atoms/cm$^3$ or less.

102 indicates a PBS film forming step wherein a raw material SiH$_4$ is decomposed under conditions of, for example, a vacuum degree of 0.2 to 1 Torr and a temperature from 600 to 700° C. to deposit polycrystal silicon on the substrate silicon wafer and form the PBS film 62 of 0.5 to 2 µm in thickness. In the invention, it is a feature that the PBS film forming step is performed in a clean room with an atmosphere of a very low boron concentration of 15 ng/m$^3$ or less, which will be described. By doing so, a boron contamination at the interface 70 between the silicon wafer W and the polycrystal silicon layer (PBS film) 62 can be suppressed.

The silicon wafer W can be taken out at this stage from the process if desired. In this case, it is possible to obtain a silicon wafer W having a polycrystal silicon layer 62 for which boron contamination is suppressed such that an increment of a boron concentration in an adjacent layer of a thickness of 1 μm adjacent to and including an interface between the polycrystal silicon layer and a single crystal silicon layer relative to a boron concentration in silicon in external contact with the adjacent layer is $1\times10^{15}$ atoms/cm$^3$ or less (FIG. 2(b)).

One surface of the taken-out silicon wafer W can also be mirror polished on one surface thereof to obtain a mirror polished silicon wafer with the polycrystal silicon layer 62 with low boron contamination on the back surface thereof. Thus obtained silicon wafer W is a wafer with the polycrystal silicon layer 62 on the back surface thereof such that an increment of a boron concentration in an adjacent layer of a thickness of 1 μm adjacent to and including an interface between the polycrystal silicon layer and a single crystal silicon layer relative to a boron concentration in silicon in external contact with the adjacent layer is $1\times10^{15}$ atoms/cm$^3$ or less.

In the invention, cleaning, drying and storage (packaging) steps after the mirror polishing are performed in a clean room with an atmosphere of a very low boron concentration of 15 ng/m$^3$ or less, which will be described later, and thereby, it is possible to obtain a silicon wafer with a polycrystal silicon layer such that no boron contamination occurs at the front surface thereof and in the vicinity of the front surface thereof. The silicon wafer W thus obtained has a polycrystal silicon layer such that in addition to reduction in boron concentration in the vicinity of the interface between the polycrystal silicon layer and a single crystal silicon layer, a boron concentration in at least part of the polycrystal silicon layer 62 is $5\times10^{14}$ atoms/cm$^3$ or less.

104 is a CVD silicon oxide film forming step, wherein, for example, SiH$_4$ and oxygen are used under an atmospheric pressure at temperature from 380 to 500° C. to deposit silicon oxide on the PBS film 62 on the back surface side of the silicon wafer W and form the CVD silicon oxide film 64 of 0.2 to 2 μm in thickness (FIG. 2(c)). In the invention, it is a feature that steps after the CVD silicon oxide film forming step are performed in a clean room with an atmosphere of a very low boron concentration of 15 ng/m$^3$ or less, which will be described later.

By doing so, a boron contamination at the interface 72 between the PBS film 62 and the CVD silicon oxide film 64 can be suppressed, that is an increment of a boron concentration in a polycrystal silicon adjacent layer of a thickness of 0.5 μm adjacent to and including an interface between the CVD silicon oxide film and the polycrystal silicon layer relative to a boron concentration in polycrystal silicon in external contact with the polycrystal silicon adjacent layer is $1\times10^{15}$ atoms/cm$^3$ or less.

Here, the PBS film forming step 102 can be omitted if desired and the CVD silicon oxide film 64 can also be formed directly on the back surface side of the silicon wafer W according to a process of the invention. The silicon wafer is such that an increment of a boron concentration in a single crystal silicon adjacent layer of a thickness within 0.5 μm of an interface between the CVD silicon oxide film and the silicon wafer relative to a boron concentration in bulk silicon in contact with the adjacent layer is $1\times10^{15}$ atoms/cm$^3$ or less.

It is possible that an epitaxial layer is formed on the wafer to obtain an epitaxial wafer. This epitaxial wafer is such that an increment of a boron concentration in a substrate single crystal silicon adjacent layer of a thickness within 0.5 μm of an interface between the CVD silicon oxide film and a substrate relative to a boron concentration in silicon of the substrate in contact with the adjacent layer is $1\times10^{15}$ atoms/cm$^3$ or less.

106 is an epitaxial layer forming step, wherein after the polycrystal silicon layer 62 on the front surface of the silicon wafer W is removed, for example, by mirror polishing (FIG. 2(d)), a mixed gas of SiHCl$_3$ and H$_2$ is supplied on the front surface of the silicon wafer W having the PBS film 62 and the CVD silicon oxide film 64 on the back surface thereof under an atmospheric pressure at temperature from 1000 to 1200° C., for example, to form an epitaxial layer 66 of 3 to 15 μm in thickness. At this time, boron diffusion into the PBS film 62 exerts no influence on a boron concentration (for example, at $3\times10^{14}$ atoms/cm$^3$) if boron contamination at the interfaces 70 and 72 is suppressed such that the attached boron amount is $1\times10^{10}$ atoms/cm$^2$ or less according to the process of the invention.

108 is an epitaxial wafer with a back surface PBS film unloading step, wherein an epitaxial wafer 68 can be obtained with a back surface PBS film such that boron contamination is suppressed as much as possible (FIG. 2(e)).

Then, description will be given of a clean room and air conditioning facilities of the invention which are suitable for use in manufacture of a silicon wafer and a silicon epitaxial wafer of the invention with reference to FIG. 3.

This embodiment is shown as one exemplification and it is needless to say that various modifications or alterations thereof are possible as far as not being departing from the conception of the invention. In FIG. 3, the same or like constituents as those in FIG. 11 are indicated by the same symbols and descriptions of constructions and functions thereof are not repeated.

Figure 3:
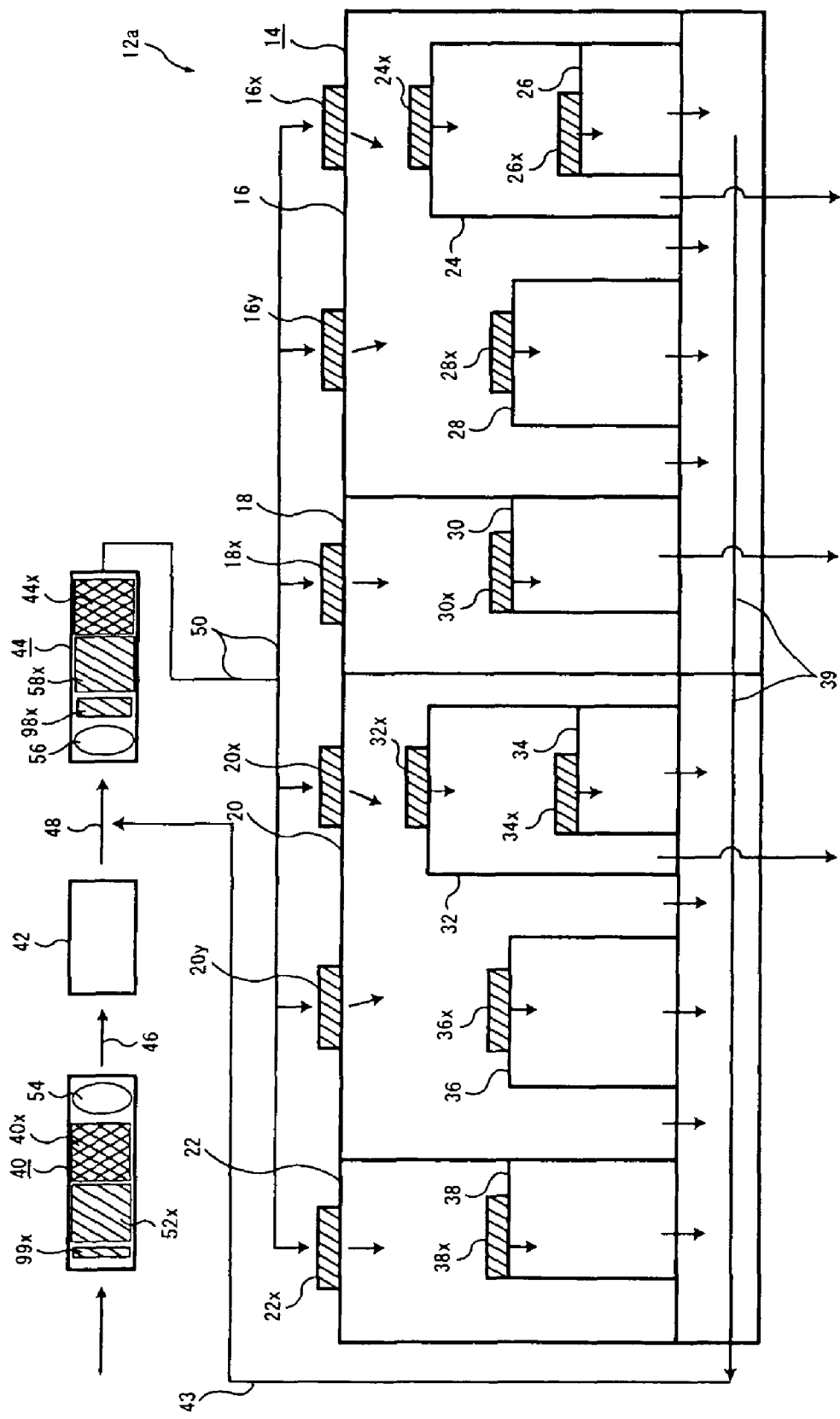
FIG. 3 is a schematic, descriptive diagram showing clean room air conditioning facilities of the invention.
Figure 11:
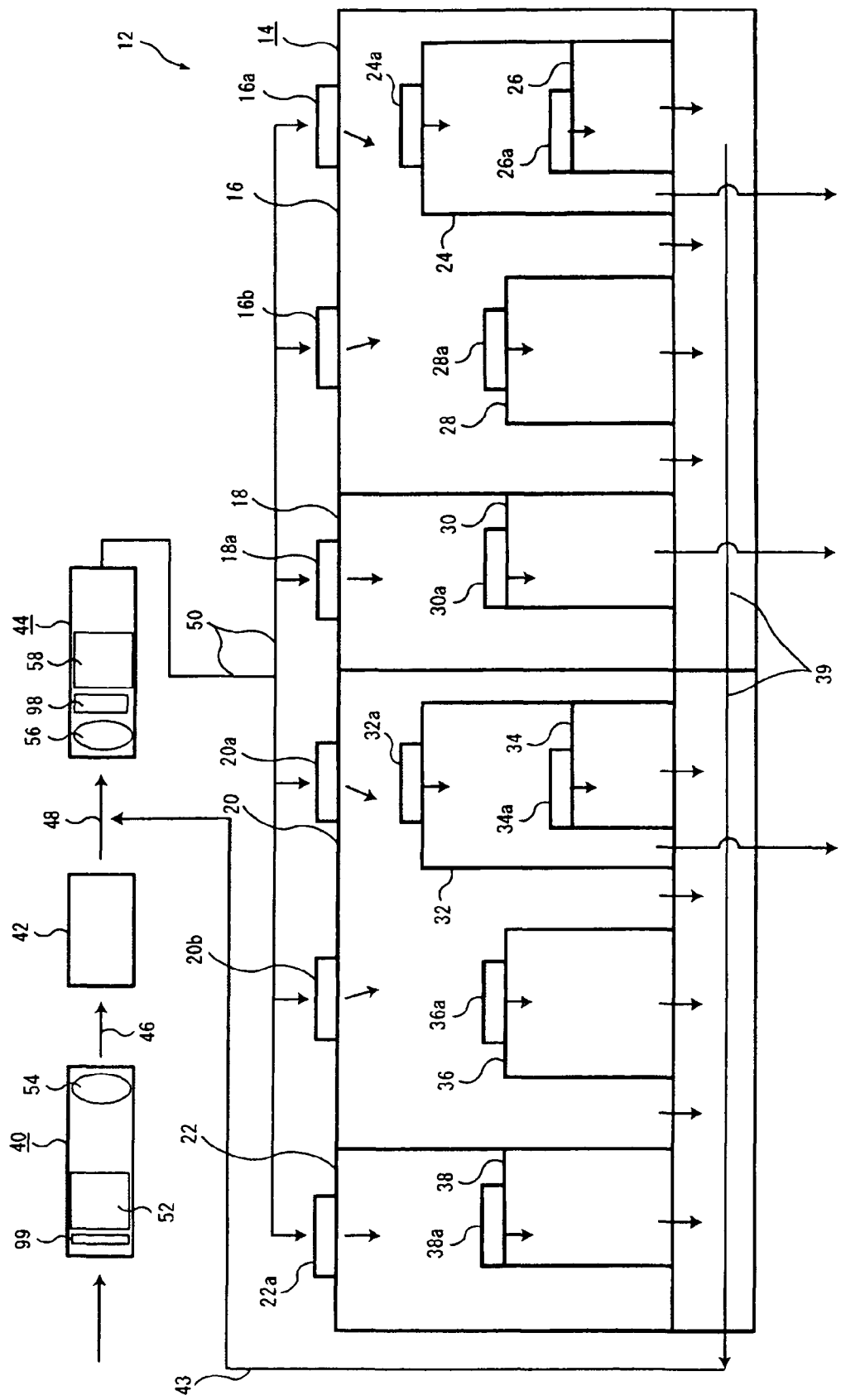
FIG. 11 is a schematic, descriptive diagram showing an example of prior art clean room air conditioning facilities.

Clean room air conditioning facilities 12a of the invention shown in FIG. 3 are of the same construction as the prior art clean room air conditioning facilities 12 shown in FIG. 11 with the exception of characteristics or performances of filters; therefore, descriptions are omitted of the constructions and functions of constituents other than the filters as long as a special need arises.

A feature of the clean room air conditioning facilities 12a of the invention is that the air filters in the prior art facilities 12: 16a, 16b, 18a, 20a, 20b, 22a, 24a, 26a, 28a, 30a, 32a, 34a, 36a and 38a are replaced with boron-less filters 16x, 16y, 18x, 20x, 20y, 22x, 24x, 26x, 28x, 30x, 32x, 34x, 36x and 38x; the medium performance filters 52 and 58 are further replaced with boron-less medium performance filters 52x and 58x; the prefilter 98 and the roll filter 99 are replaced with a boron-less prefilter 98x and a boron-less roll filter 99x; in addition to those, a boron adsorbing filter 40x is used at a site downstream of the boron-less medium performance filter 52x of the outdoor air cleaner 40 and a boron adsorbing filter 44x is disposed at a site downstream of the boron-less medium performance filter 58x of the air conditioner 44.

In the clean room air conditioning facilities 12a of the invention having the above described construction, the outside air flows through the outdoor air cleaner 40, the impurity removal apparatus 42 and the air conditioner 44, and is then introduced into the CVD treatment room 16, the CVD furnace room 18, the PBS film forming room 20 and the PBS furnace room 22 by way of the boron-less filters 16x, 16y, 18x, 20x, 20y and 22x.

The air introduced into the rooms is further guided into the cleaner 24 via the boron-less filter 24x, into the dryer 26 via the boron-less filter 26x, into the storage clean booth 28 via the boron-less filter 28x, into the CVD apparatus 30 via the boron-less filter 30x, into the PBS precleaner 32 via the boron-less filter 32x, into the dryer 34 via the boron-less filter 34x, into the storage clean booth 36 via the boron-less filter 36x, and into the PBS apparatus 38 via the boron-less filter 38x; and finally discharged out into the air outlet space 39.

For example, part of the air is discharged directly from the cleaners 24 and 32, and all of the air is discharged directly from the CVD apparatus 30. The air having arrived at the air outlet space 39 amounts to about 80% of the total supply of the outside air, which is returned into the second air pipe 48 by way of the recovery pipe 43 for second use.

By using the above described clean room air conditioning facilities 12a of the invention, a boron concentration in an atmosphere in the clean room 14 can be set to 15 ng/m$^3$ or less.

As the above described boron-less filters 16x, 16y, 18x, 20x, 20y and 22x, boron-free ULPA filters (Nippon Muki Co., Ltd. ATMMF-31-P-B) may be adopted, to be concrete; as the boron-less medium performance filters 52x and 58x, boron-less medium performance filters (Nippon Muki Co., Ltd. FML-56-90) may be adopted; as the boron-less roll filter 99x (Nippon Muki Co., Ltd. DSR-340R-TH-C-2) may be adopted; and further as the boron adsorbing filters 40x and 44x, boron adsorbing filters (Nippon Muki Co., Ltd. ACS-31-Q-b) may be adopted.

EXAMPLES

While description will be given taking up examples of the invention below, needless to say that the examples are shown by way of illustration, but should not be construed by way of limitation.

Experiment 1

Formation of an Atmosphere of a Boron Concentration of 15 ng/m$^3$ or Less

The clean room air conditioning facilities shown in FIG. 3 (as the filters, the exemplified products were used as concrete examples) were used and boron concentrations in the air before and after the filters were measured in operating conditions: for the outdoor air cleaner, an air volume of 7000 m$^3$/hr under a pressure of 20 to 30 mm H$_2$O above the ambient atmospheric pressure; for the air conditioner, an air volume of 37500 m$^3$/hr under a pressure of 25 to 35 mmH$_2$O above the ambient atmospheric pressure; and for the clean room, under an internal pressure of 3.0 to 4.0 mmH$_2$O above an external pressure. Results are shown in Table 1 and it is seen from the results that the boron concentrations in the air after passing through any of the filters were controlled to be 15 ng/m$^3$ or less. In addition to this, the content of particles in the clean room atmosphere was zero.

TABLE 1

|  | the boron concentration in the air before the filter (ng/m$^3$) | the boron concentration in the air after the filter (ng/m$^3$) |
| --- | --- | --- |
| at the outdoor air cleaner | 10~30 | 2~10 |
| at the air conditioner | 5~25 | 2~10 |
| at the ceiling | 2~10 | 2~10 |
| in the room | — | 4~13 |

In Note that measurement of a boron concentration in the air was conducted as follows:
Recovery method for boron:
    dissolving into pure water: air suction type using an impinger
    pure water volume for recovery before sampling: 20 ml
    recovered pure water volume after sampling: about 17.5 ml
    suction flow rate: 1 l/min
    suction time: 4 hrs
    boron analysis: ICP-MS (Inductively Coupled Plasma Mass Spectrometry)
    measuring instrument: made by MICROMASS Limited, PLASMATRACE 2

A boron concentration in the air was obtained in a procedure that a measured value is multiplied by a measurement liquid volume to obtain a mass and the mass is divided by an air sample volume.

Example 1

PBS Film Forming Treatment in the Atmosphere of Experiment 1

Figure 4:
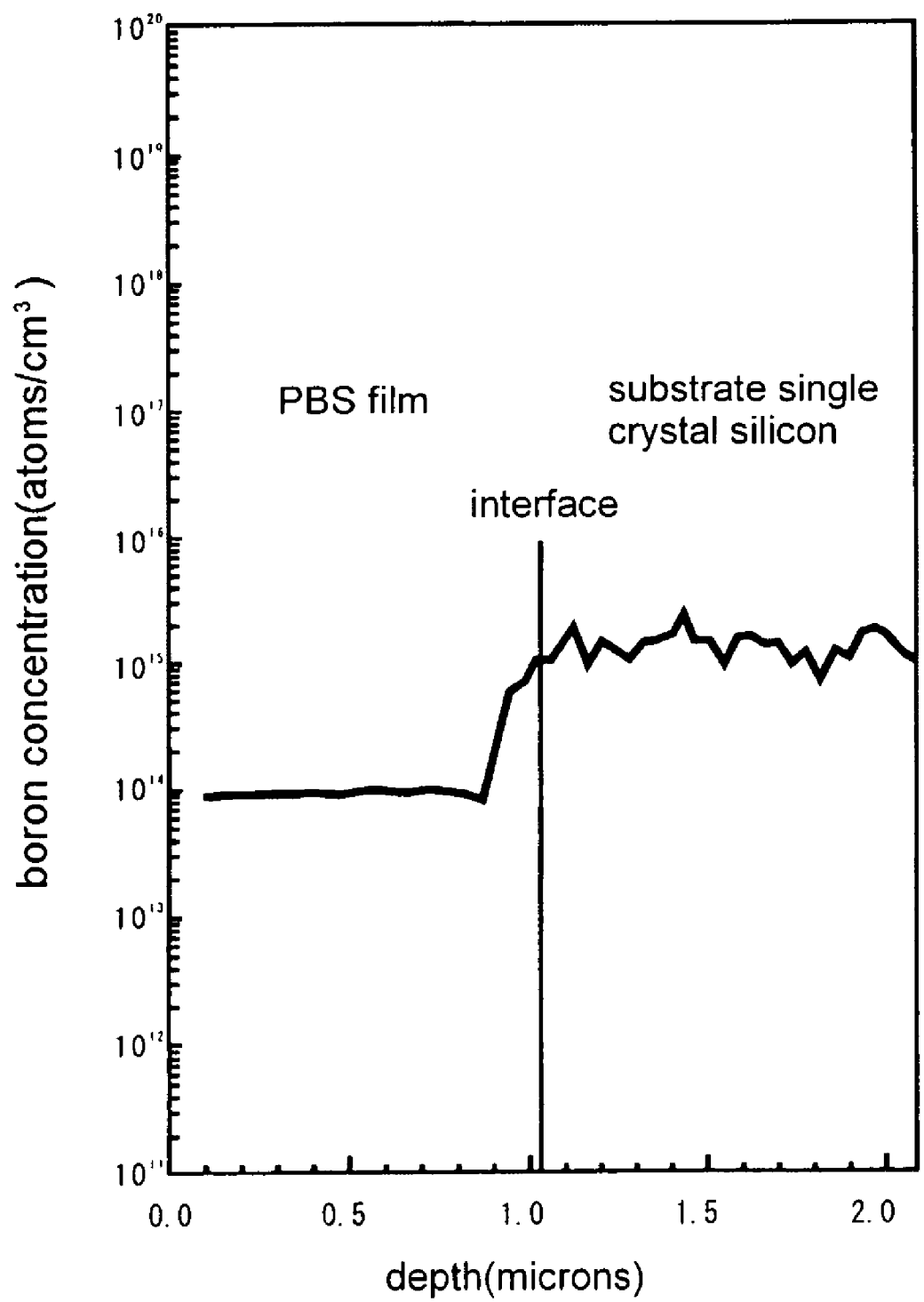
FIG. 4 is a graph showing a boron concentration distribution in a specimen along a depth direction thereof in Example 1.

* Specimen
silicon wafer: diameter of 200 mm, CZ-P type, 8 to 15 Ω·cm, crystallographic orientation <100>,
* PBS Film Forming Step
precleaning: SC-1 (ammonia, hydrogen peroxide and water)→dilute hydrofluoric acid cleaning→SC-2 (hydrochloric acid, hydrogen peroxide and water)→spin dry
PBS treatment: temperature; 650° C., time; 3.5 hrs, reaction gas; monosilane, film thickness; 1.2 μm PBS film formation was conducted using the specimens under the above described conditions in the clean room atmosphere of Experiment 1 (a boron concentration of 4 to 13 ng/m$^3$). Measurement of a boron concentration in the specimens was conducted using SIMS (Secondary Ion Mass Spectrometer, IMS-4F made by CAMECA, France) and results are shown in FIG. 4. As can be seen from FIG. 4, boron concentrations in a PBS film are $1 \times 10^{14}$ atoms/cm$^3$ or less and a boron concentration (about $6 \times 10^{14}$ atoms/cm$^3$) in an adjacent layer of a thickness of 1 μm adjacent to and including the interface between the PBS film and silicon of the substrate is lower than a boron concentration (about $1 \times 10^{15}$ atoms/cm$^3$) in single crystal silicon of the substrate in external contact with the adjacent layer: the relative increment in a boron concentration of the adjacent layer was negative, and an increment of a boron concentration thereof relative to a boron concentration (about $1 \times 10^{14}$ atoms/cm$^3$) in the PBS layer is $5 \times 10^{14}$ atoms/cm$^3$.

Comparative Example 1

PBS Film Formation in a Prior Art Atmosphere

Figure 5:
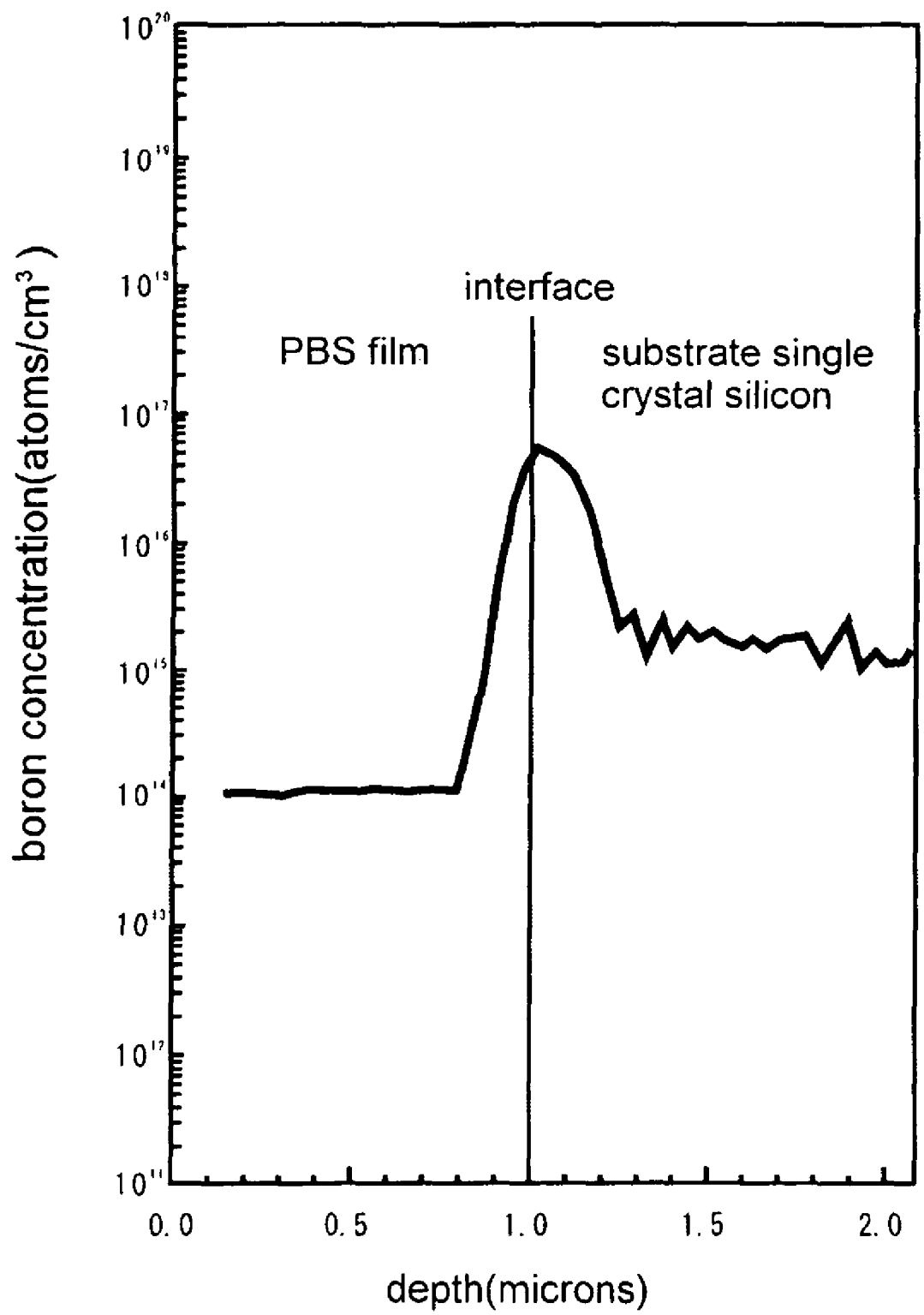
FIG. 5 is a graph showing a boron concentration distribution in a specimen along a depth direction thereof in Comparative Example 1.

PBS film formation was conducted using similar specimens of Example 1 under the same conditions as Example 1 in a prior art atmosphere (a boron concentration of 50 to 80 ng/m$^3$). Measurement of a boron concentration in the specimens was performed similar to Example 1 and results thereof are shown in FIG. 5. A difference between the boron concentration distributions of FIGS. 4 and 5 indicates an influence of boron contamination due to a difference between boron concentrations in the respective atmospheres, wherein in FIG. 5, a boron concentration in the PBS film rapidly rises in the vicinity of the interface, the maximum value amounts to about $6 \times 10^{16}$ atoms/cm$^3$ and a boron concentration in an adjacent layer of a thickness 1 μm adjacent to and including an interface between the PBS layer and silicon of the substrate is about $3 \times 10^{16}$ atoms/cm$^3$ and an increment of a boron concentration thereof relative to a boron concentration in the PBS layer and silicon single crystal in external contact with the adjacent layer exceeds $1 \times 10^{16}$ atoms/cm$^3$ by a great amount.

Example 2

PBS Film Formation+CVD Treatment in the Atmosphere of Experiment 1

* Specimens
silicon wafer: diameter of 200 mm, CZ-P type, 8 to 15 Ω·cm, crystallographic orientation <100>,
* PBS Film Forming Step
precleaning: SC-1 (ammonia, hydrogen peroxide and water)→dilute hydrofluoric acid cleaning→SC-2 (hydrochloric acid, hydrogen peroxide and water)→spin dry
PBS treatment: temperature; 650° C., time; 3.5 his, reaction gas; monosilane, film thickness; 1.2 μm
*CVD Treatment Step
precleaning: SC-1 (ammonia, hydrogen peroxide and water)→dilute hydrofluoric acid cleaning→SC-2 (hydrochloric acid, hydrogen peroxide and water)→spin dry
CVD treatment: temperature; 430° C., time; 10 min, reaction gas; (1) monosilane and (2) oxygen, film thickness; 0.3 μm
*Epitaxial Treatment Step
precleaning: SC-1 (ammonia, hydrogen peroxide and water)→SC-2 (hydrochloric acid, hydrogen peroxide and water)→IPA dry
Epitaxial treatment: temperature; 1100° C., time; 10 min, reaction gas; (1) trichlorosilane and (2) hydrogen, film thickness; 5.0 μm PBS film formation and CVD silicon oxide film formation were conducted using the specimens under the above described conditions in the clean room atmosphere of Experiment 1 (a boron concentration of 4 to 13 ng/m$^3$), followed by epitaxial film growth. After a CVD silicon oxide film on the back surface of a specimen was dissolved off using a 20% HF solution, measurement of a boron concentration in the PBS film of the specimen and single crystal silicon of the substrate were performed in the procedure similar to that in Example 1 and results thereof are shown in FIG. 6.

Figure 6:
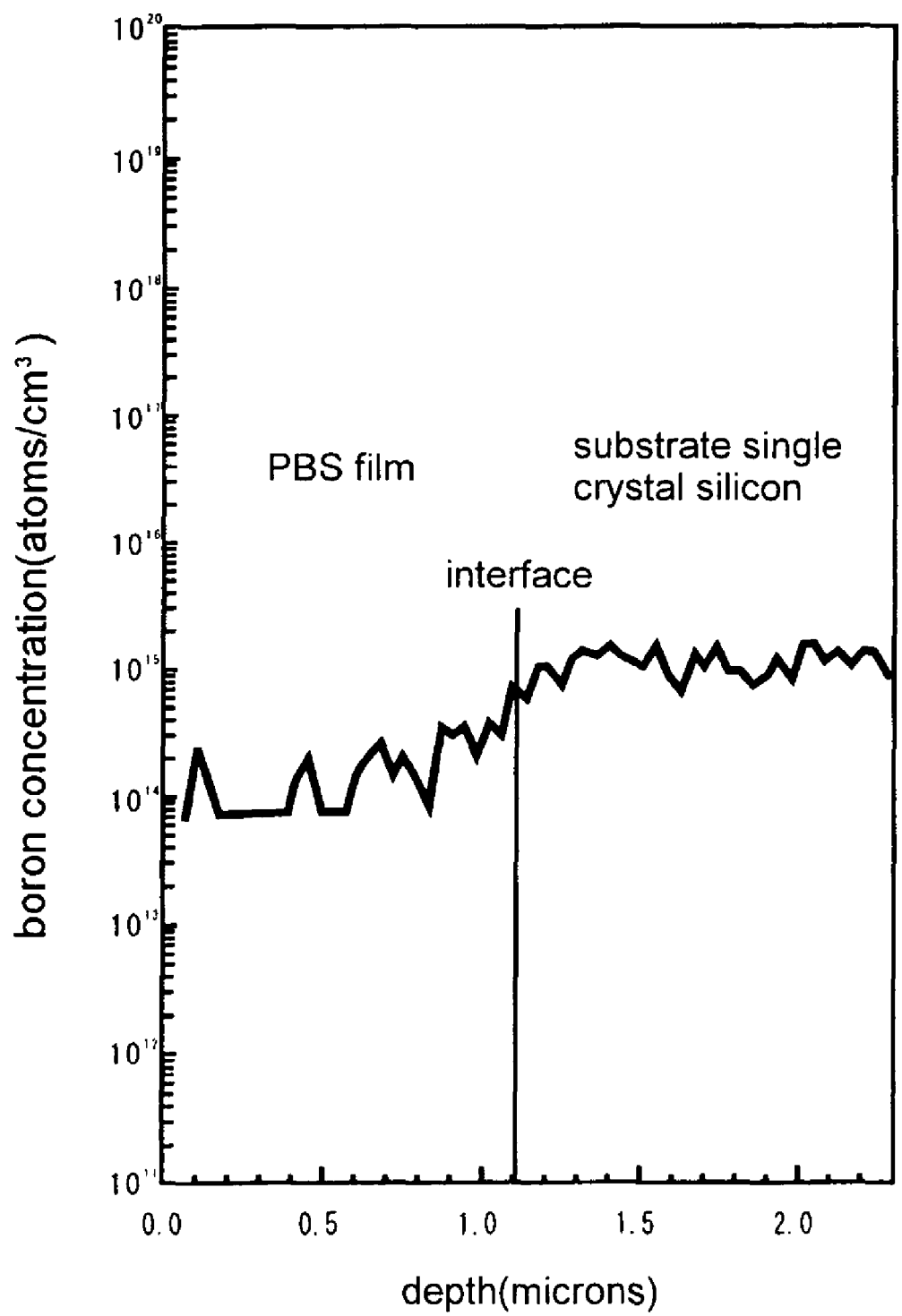
FIG. 6 is a graph showing a boron concentration distribution in a specimen along a depth direction thereof in Example 2.

As can be seen from FIG. 6, while it is confirmed that boron diffused into the PBS film from single crystal of the substrate by heating during epitaxial film formation, a boron concentration in an adjacent layer of a thickness of 1 μm adjacent to and including an interface between the PBS layer and single crystal silicon of the substrate is about $6\times10^{14}$ atoms/cm$^3$ and an increment of a boron concentration thereof relative to a boron concentration (about $1\times10^{14}$ atoms/cm$^3$) in the PBS layer in external contact with the adjacent layer is less than $1\times10^{15}$ atoms/cm$^3$ and further the boron concentration is rather lower than a boron concentration (about $1\times10^{15}$ atoms/cm$^3$) in single crystal in external contact with the adjacent layer, and thus it was confirmed that a level of boron contamination in wafer treatment is suppressed to a low level.

Comparative Example 2

PBS Film Formation in the Prior Art Atmosphere+CVD Treatment in the Atmosphere of Example 1

PBS film formation was conducted using specimens similar to those in Example 2 under the same conditions as Example 2 in the prior art atmosphere (a boron concentration of 50 to 80 ng/m$^3$). Then, CVD silicon oxide film formation was conducted in the same conditions as Example 2 in the clean room atmosphere of Example 1 (a boron concentration of 4 to 13 ng/m$^3$) and in succession to this, epitaxial film growth was conducted. After the CVD silicon oxide film on the back surface was dissolved off using a 20% HF solution, measurement of boron concentrations in the PBS film and single crystal silicon of the substrate were performed in the procedure similar to that in Example 1 and results thereof are shown in FIG. 7.

Figure 7:
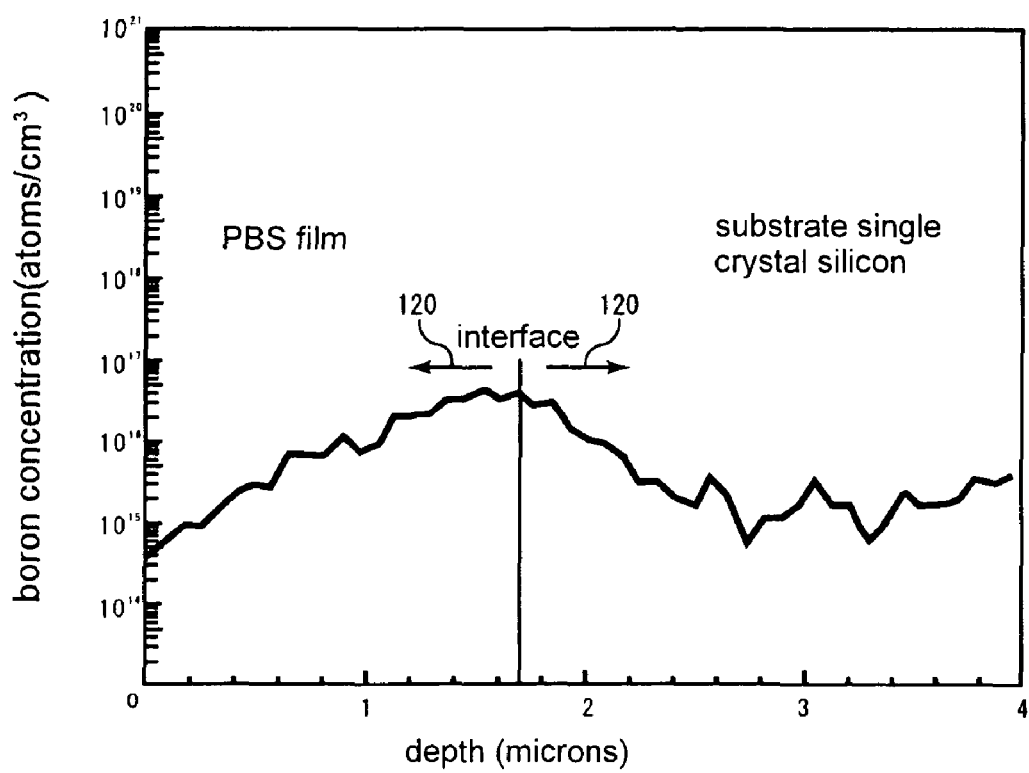
FIG. 7 is a graph showing a boron concentration distribution in a specimen along a depth direction thereof in Comparative Example 2.

As can be seen from FIG. 7, boron in the atmosphere was attached onto the surface of a single crystal silicon wafer, which is a substrate and a specimen, prior to the PBS film forming step and the boron diffused into the PBS film and single crystal silicon of the substrate by heating during epitaxial film formation. However, a boron concentration in an adjacent layer of a thickness of 1 μm adjacent to and including an interface between the PBS layer and single crystal silicon of the substrate is about $3\times10^{16}$ atoms/cm$^3$ on the average, which is greatly higher than not only a boron concentration of about $1.2\times10^{15}$ atoms/cm$^3$ on the average in single crystal of the substrate in external contact with the adjacent layer but also a boron concentration of about $1\times10^{16}$ atoms/cm$^3$ on the average in the PBS layer in external contact with the adjacent layer.

A boron concentration in the PBS film at a distance of 0 μm from the interface between the CVD silicon oxide film and PBS film, that is at the interface therebetween, is $4\times10^{14}$ atoms/cm$^3$, which shows that since a boron concentration in the atmosphere in the CVD silicon oxide film forming stage was restricted to 15 ng/m$^3$ or less, the boron concentration at the interface was, as a result, suppressed to a value close to a boron concentration of $1\times10^{14}$ atoms/cm$^3$ in the PBS.

Comparative Example 3

PBS Film Formation in the Atmosphere of Experiment 1+CVD Treatment in the Prior Art Atmosphere PBS film formation was conducted using specimens similar to those in Example 2 under the same conditions as Example 2 in the clean room atmosphere of Experiment 1 (a boron concentration of 4 to 13 ng/m$^3$) and subsequent this, CVD silicon oxide film formation was conducted in the same conditions as Example 2 in the prior art atmosphere (a boron concentration of 50 to 80 ng/m$^3$), followed by epitaxial film growth. After the CVD silicon oxide film on the back surface was dissolved off using a 20% HF solution, measurement of a boron concentration in the PBS film and the single crystal of the substrate were performed in the procedure similar to that in Example 1 and results thereof are shown in FIG. 8.

Figure 8:
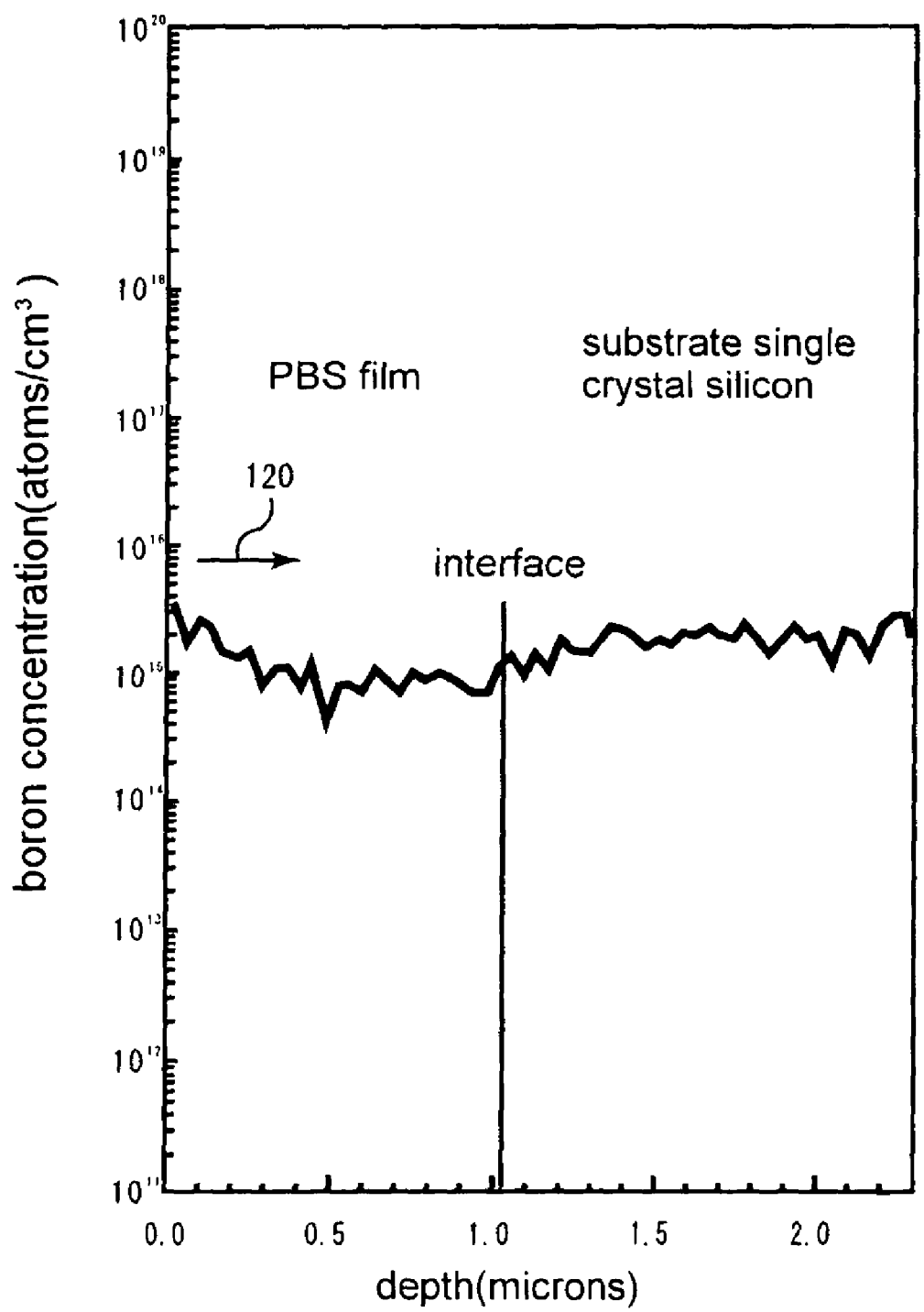
FIG. 8 is a graph showing a boron concentration distribution in a specimen along a depth direction thereof in Comparative Example 3.

As can be seen from FIG. 8, attached boron in an atmosphere of a high boron concentration diffused into the PBS film from the interface between the PBS film and the CVD silicon oxide film (at a plane of a depth of 0 μm in the figure) and an average boron concentration in a surface layer of a depth of 0.5 μm reached as high a value as $2\times10^{15}$ atoms/cm$^3$, which showed a great increment of boron average concentration relative to an average boron concentration of about $8\times10^{14}$ atoms/cm$^3$ in the PBS film equal to or more than 0.5 μm in depth. On the other hand, since PBS film formation was conducted in a state where a boron concentration in the atmosphere was suppressed to 15 ng/m$^3$ or less, an average boron concentration in an adjacent layer of a thickness of 1 μm adjacent to and including the interface between the PBS film and single crystal of the substrate is about $1.5\times10^{15}$ atoms/cm$^3$ and a boron concentration is suppressed to an average boron concentration of about $2\times10^{15}$ atoms/cm$^3$ or less in single crystal silicon in external contact with the adjacent layer.

That is, it was found that an attached boron amount on a single crystal silicon surface of the substrate was as small as not to exert almost no influence on a prescribed boron concentration; therefore, the boron diffusing into the PBS film from the interface exerts almost no influence on a boron concentration in the PBS film in process.

Comparative Example 4

PBS Film Formation and CVD Treatment in the Prior Art Atmosphere

PBS formation was conducted using similar specimens as Example 2 under the same conditions as Example 2 in the prior art atmosphere (a boron concentration of 50 to 80 ng/m$^3$). Then, in the same atmosphere CVD silicon oxide film formation was conducted in the same conditions as Example 2, followed by epitaxial film growth. After the CVD silicon oxide film on the back surface was dissolved off using a 20% HF solution, measurement of a boron concentration in the specimens was performed similar to Example 1 and results are shown in FIG. 9.

Figure 9:
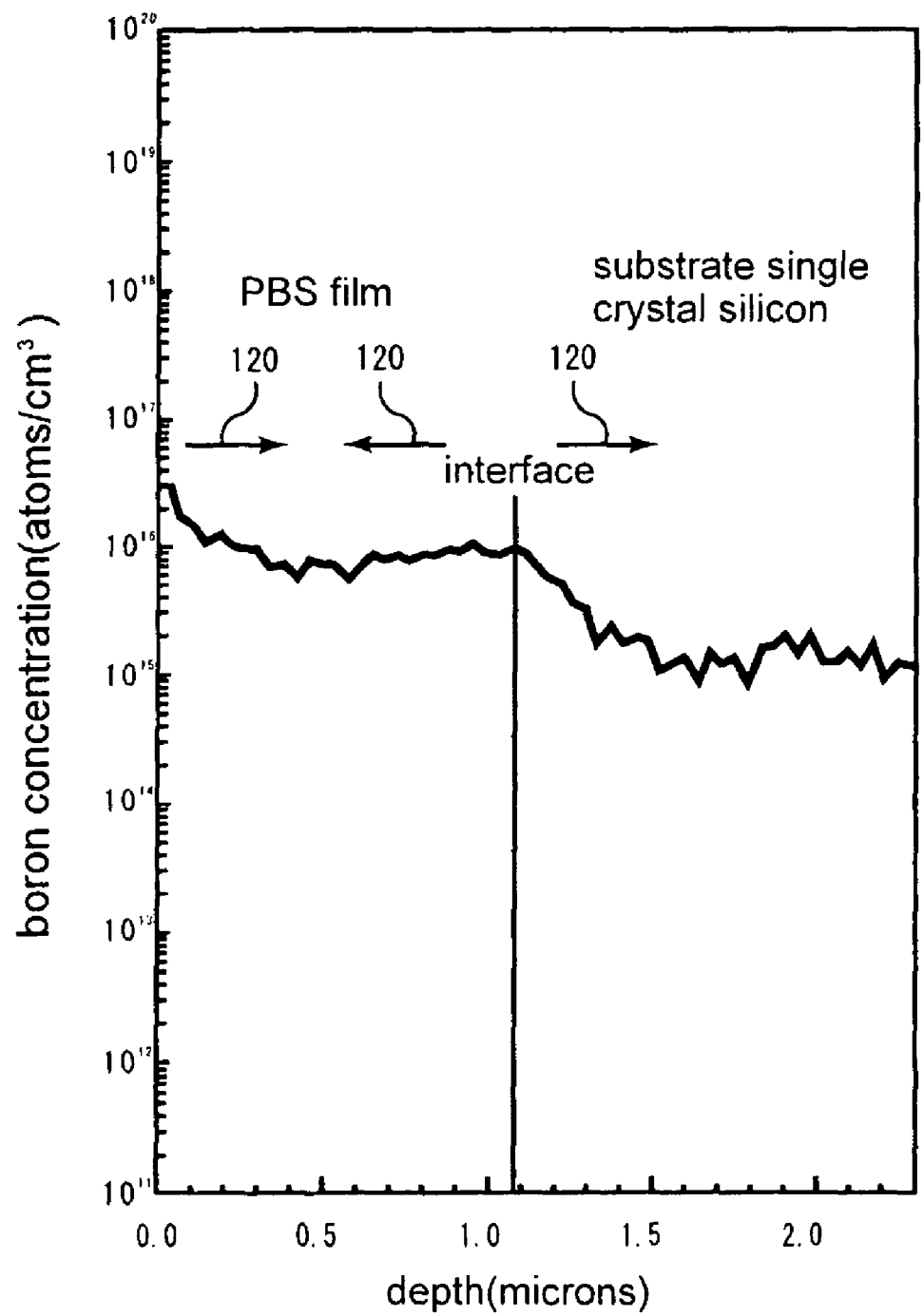
FIG. 9 is a graph showing a boron concentration distribution in a specimen along a depth direction thereof in Comparative Example 4.
Figure 10:
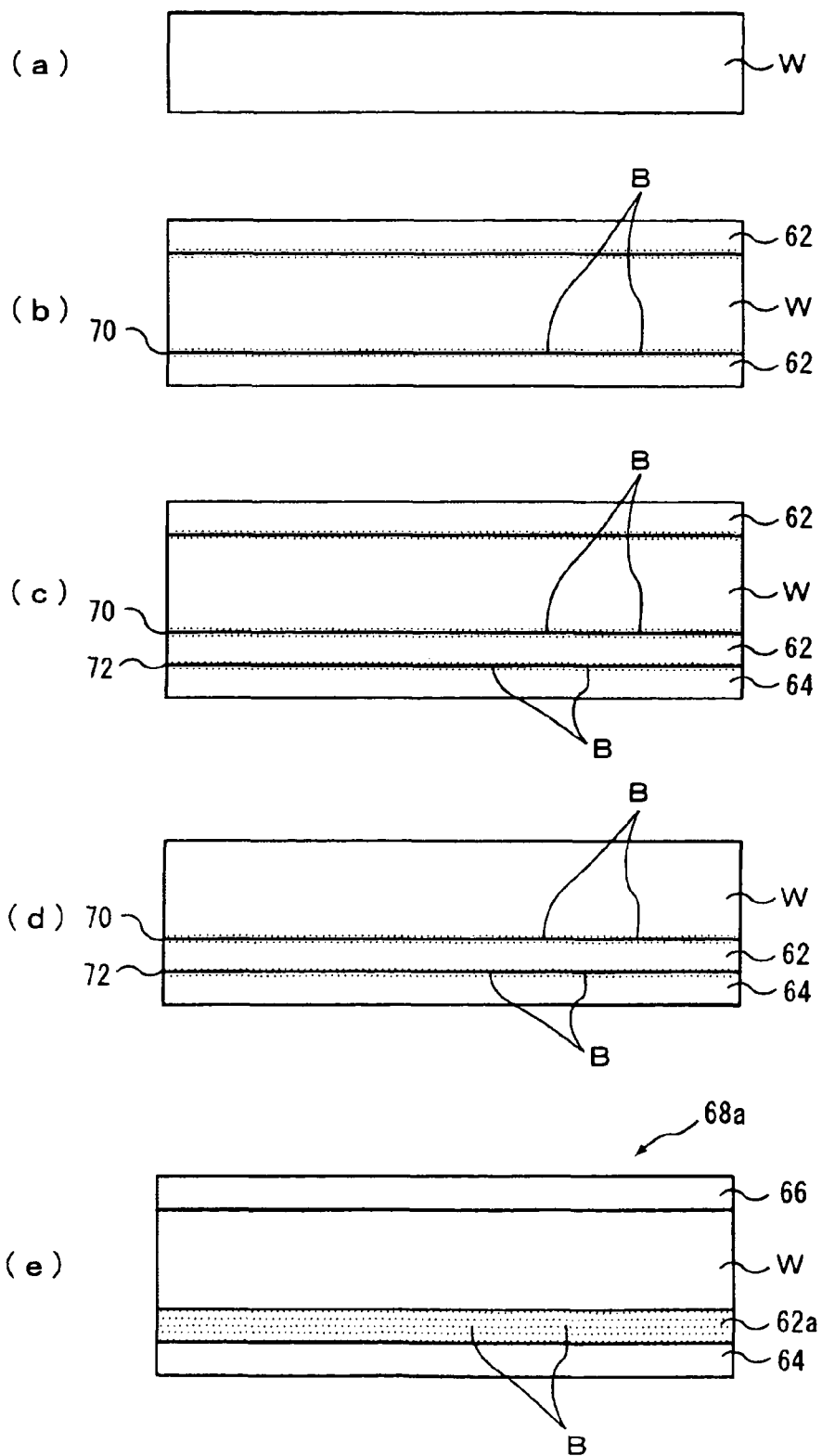
FIG. 10 is a descriptive diagram showing prior art manufacturing processes for a silicon wafer and a silicon epitaxial wafer, wherein (a) shows a silicon wafer, (b) a state after a polycrystal silicon layer is formed on the silicon wafer, (c) a state after a CVD silicon oxide film is further formed on the polycrystal silicon layer (PBS film) on the back surface of the silicon wafer of (b), (d) a state after the polycrystal silicon layer on the front surface of the silicon wafer is removed, and (e) a state after an epitaxial layer is formed on the front surface of the silicon wafer following the state of (d)

As can be seen from FIG. 9, a boron concentration in the PBS film shows higher values by approximately more than one order of magnitude as compared with FIGS. 7 and 8 because of diffusion of attached boron at the interface between the PBS film and single crystal of the substrate and diffusion of attached boron at the interface (at a depth of zero μm) between the CVD silicon oxide film and the PBS film. An average boron concentration of about $4 \times 10^{15}$ atoms/cm$^3$ in an adjacent layer of a thickness of 1 μm including the interface between the PBS film and single crystal silicon of the substrate has an increment of about $2.5 \times 10^{15}$ atoms/cm$^3$ relative to an average boron concentration of about $1.5 \times 10^{15}$ atoms/cm$^3$ of single crystal silicon of the substrate in external contact with the adjacent layer.

Furthermore, as can be seen from the above described examples and comparative examples, it was found that a boron concentration in at least part of the PBS film formed in an atmosphere of a restricted boron concentration of 15 ng/m$^3$ or less is $3 \times 10^{14}$ atoms/m$^3$ or less.

Note that in FIGS. 4 to 9, a vertical line in the middle of each of FIGS. 4 to 9 indicates an interface and the left side of the interface is a PBS film and the right side is single crystal of the substrate. In FIGS. 7 to 9, a symbol 120 indicates a direction of boron diffusion in an epitaxial layer growing step.

Comparative Example 5

In this comparative example, the prior art clean room air conditioning facilities shown in FIG. 11 were employed, wherein the filters were as follows: the outdoor air cleaner roll filter of Nippon Muki Co., Ltd. AT-200-KS; the outdoor air cleaner medium performance filter of Nippon Muki Co., Ltd. ASTC-56-95; the air conditioner prefilter of Nippon Muki Co., Ltd. DS-600-31-REA-20; the air conditioner medium performance filter of Nippon Muki Co., Ltd. ASTC-560-95; and the clean room ULPA of Nippon Muki Co., Ltd. NMO-320. Operating conditions were as follows: for the outdoor air cleaner, an air volume of 7000 m$^3$/hr under 10 to 20 mmH$_2$O above the ambient atmospheric pressure; for the air conditioner, an air volume of 37500 m$^3$/hr under a pressure of 15 to 25 mmH$_2$O above the ambient atmospheric pressure; and for the clean room, under an internal pressure of 3.0 to 4.0 mm H$_2$O above the external pressure. Measurement of a boron concentration in the air before and after passing through filters was conducted in the procedure similar to that in Example 1 and results thereof are shown in Table 2.

As can be seen from the results in Table 2, it was impossible that a boron concentration in the air after passing through each of the filters is controlled to be 15 ng/m$^3$ or less. Note that the content of particles in a clean room atmosphere was zero. Furthermore, a wafer treatment was conducted in the clean room atmosphere and it was impossible that a boron concentration in a wafer is reduced to be $1 \times 10^{15}$ atoms/cm$^3$ or less because of attached boron on the wafer.

TABLE 2

| | the boron concentration in the air before the filter (ng/m$^3$) | the boron concentration in the air after the filter (ng/m$^3$) |
|---|---|---|
| at the outdoor air cleaner | 10~30 | 10~30 |
| at the air conditioner | 20~50 | 30~60 |
| at the ceiling | 30~60 | 50~70 |
| in the room | — | 50~80 |

Experiment 2

Figure 12:
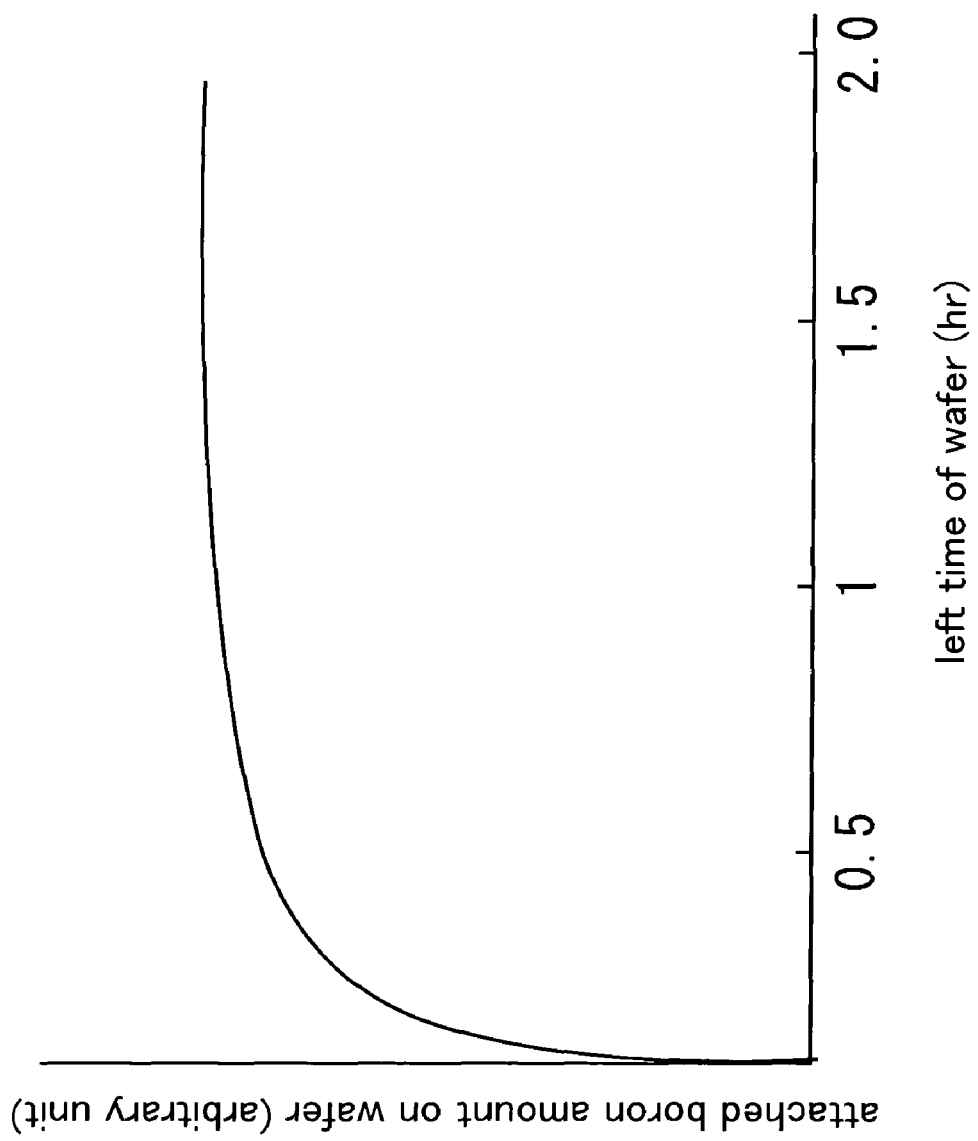
FIG. 12 is a graph showing a relationship between a left time of a wafer and an attached boron amount on a wafer surface in Experiment 2.

Silicon wafers similar to those of Example 2 were subjected to precleaning in the conditions similar to those in Example 2, thereafter the silicon wafers were left for 2 hrs in a clean room in conditions of a relative humidity of 30 to 50%; a temperature of 25° C.±3° C., a pressure of 3 to 5 mmH$_2$O above the external pressure and a boron concentration of 60 ng/m$^3$, and an investigation was conducted about a relationship between a left time and an attached boron amount on a wafer surface using SIMS (apparatus: IMS-4F, made by CAMECA, France), whose results are shown in FIG. 12. As can be seen from FIG. 12, it was confirmed that after the left time exceeds 1 hr, the attached boron amount gets to a saturated state.

Experiment 3

Figure 13:
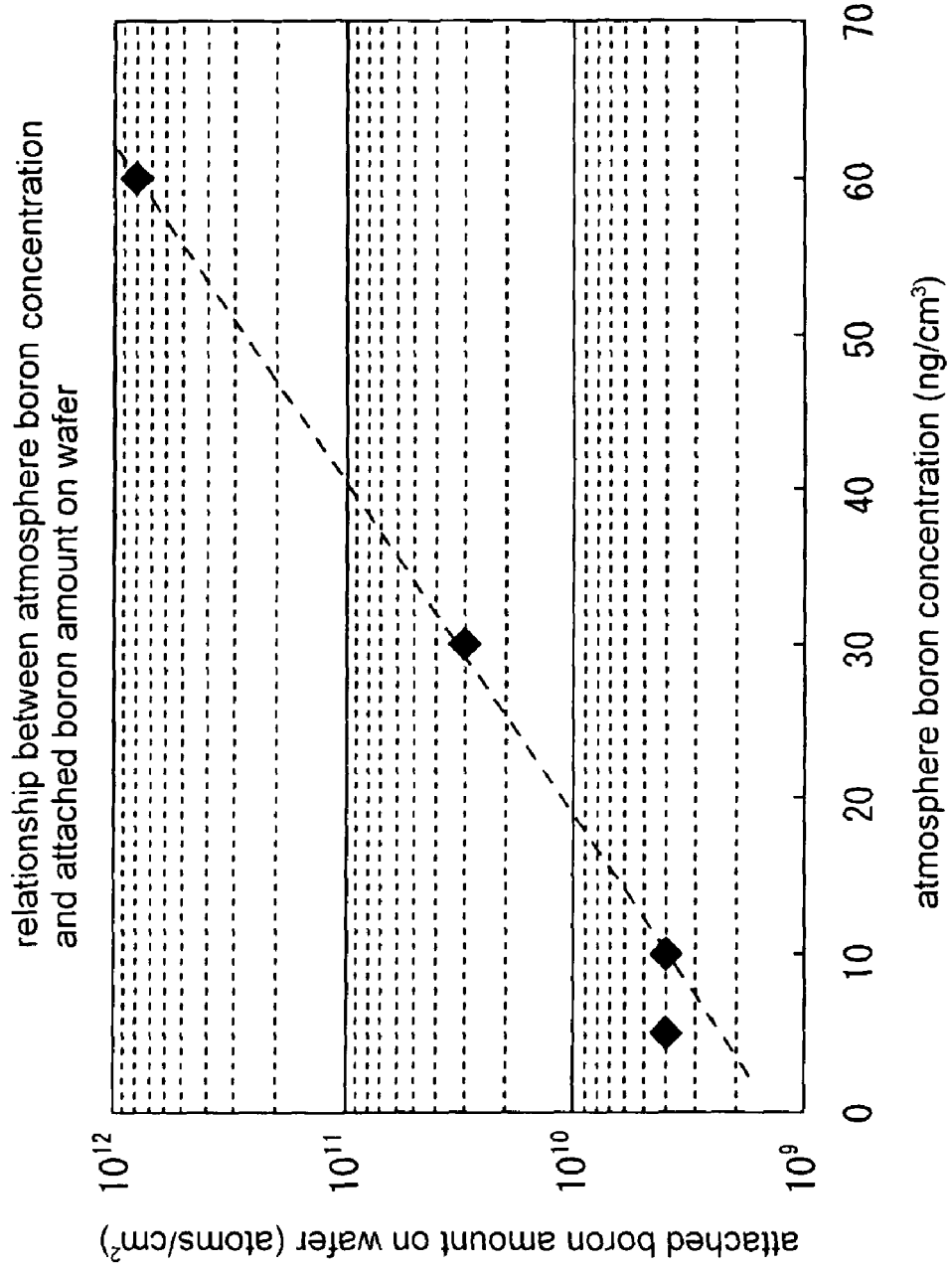
FIG. 13 is a graph showing a relationship between a boron concentration in an environmental atmosphere and an attached boron amount on a silicon wafer surface in Experiment 3.

Silicon wafers similar to those of Example 2 were left in the atmosphere of a clean room in the same conditions as those in Example 2 with the exception that a boron concentration in the atmosphere was altered in four levels of 5, 10, 30 and 60 ng/m$^3$ for 2 hrs and measurement on each case was conducted about an attached boron amount (atoms/cm$^2$) on a wafer surface using SIMS similar to Example 2 and a relationship between a boron concentration in the atmosphere and an attached boron amount was quantitatively investigated as shown in FIG. 13. As can be seen from FIG. 13, it was found that when a boron concentration in the environmental atmosphere is 15 ng/m$^3$ or less, the attached boron amount on a wafer surface is suppressed to $1 \times 10^{10}$ atoms/cm$^2$ or less.

While in the above described examples and comparative examples, p-type silicon wafers doped with boron at a relatively low concentration were used, the invention is not limited to those cases, but can be effectively applied in cases of n-type silicon wafers doped with phosphorous, arsenic, antimony and the like.

Capability of Exploitation in Industry

As described above, since in a silicon wafer and a silicon epitaxial wafer of the invention, boron contamination amounts on surfaces thereof, a PBS film and single crystal silicon of a substrate, and at the interfaces between the PBS film and a CVD silicon oxide film, between the single crystal silicon of a substrate and an epitaxial layer are suppressed to a prescribed concentration or less, the silicon wafer and the silicon epitaxial wafer are stabilized in quality and exert an effect of no adverse influence on device characteristics.

According to manufacturing processes for a silicon wafer and a silicon epitaxial wafer of the invention, an advantage can be enjoyed that a silicon wafer and a silicon epitaxial wafer stabilized in quality of the invention are efficiently manufactured at low cost.

According to an atmosphere control apparatus and a clean room of the invention, boron concentrations in the atmospheres in the apparatuses and the clean room atmosphere are controlled to a prescribed value or less; therefore, an attached boron amount on a wafer can be suppressed to an extremely low level. Furthermore, according to clean room air conditioning facilities of the invention, a boron concentration in a clean room atmosphere can be reduced by a great margin; therefore, an effect is achieved of being capable of manufacturing various kinds of silicon wafers or an epitaxial wafers on which boron contamination is restricted in a stable manner.

The invention claimed is:

1. Clean room air conditioning facilities comprising: an air conditioner having a boron-less filter and a boron adsorbing filter; and one or more of wafer treatment apparatuses each having a boron-less filter, wherein an atmosphere gas is recycled between the air conditioner, the clean room and the wafer treatment apparatuses.

2. Clean room air conditioning facilities according to claim 1, further including an outdoor air cleaner having a boron-less filter and a boron adsorbing filter.

3. Clean room air conditioning facilities according to claim 1, in which an internal pressure of a wafer treatment apparatus is adjusted to be higher than a clean room internal pressure and the clean room internal pressure is adjusted to be higher than an external pressure.

4. A manufacturing process for a wafer, characterized in that manufacture of the wafer is performed using clean room air conditioning facilities according to claim 1, the wafer being characterized in that an attached boron amount on a surface of the silicon wafer is $1\times10^{10}$ atoms/cm$^2$ or less.

5. A manufacturing process for a wafer, characterized in that manufacture of the wafer is performed using clean room air conditioning facilities according to claim 1, the wafer being characterized in that an increment of a boron concentration in a surface layer down to a depth of 0.5 μm relative to a boron concentration in bulk silicon direct beneath the surface layer is $1\times10^{15}$ atoms/cm$^3$ or less.

6. A manufacturing process for a wafer, characterized in that manufacture of the wafer is performed using clean room air conditioning facilities according to claim 1, the wafer being characterized in that the silicon wafer has a polycrystal silicon layer on one of major surfaces thereof and an increment of a boron concentration in an adjacent layer of a thickness of 1 μm adjacent to and including an interface between the polycrystal silicon layer and a single crystal silicon layer relative to a boron concentration in silicon in external contact with the adjacent layer is $1\times10^{15}$ atoms/cm$^3$ or less.

7. A manufacturing process for a wafer, characterized in that manufacture of the wafer is performed using clean room air conditioning facilities according to claim 1, the wafer being characterized in that the silicon epitaxial wafer has a structure in which a polycrystal silicon layer is provided on a back surface of a single crystal silicon substrate and an increment of a boron concentration in an adjacent layer of a thickness of 1 μm adjacent to and including an interface between single crystal silicon of the substrate and the polycrystal silicon layer relative to a boron concentration in silicon of the substrate in external contact with the adjacent layer is $1\times10^{15}$ atoms/cm$^3$ or less.

8. A manufacturing process for a wafer, characterized in that manufacture of the wafer is performed using clean room air conditioning facilities according to claim 1, the wafer being characterized in that the silicon wafer has a structure in which a CVD silicon oxide film is provided on one of major surfaces thereof and an increment of a boron concentration in a single crystal silicon adjacent layer of a thickness within 0.5 μm of an interface between the CVD silicon oxide film and the silicon wafer relative to a boron concentration in bulk silicon in contact with the adjacent layer is $1\times10^{15}$ atoms/cm$^3$ or less.

9. A manufacturing process for a wafer, characterized in that manufacture of the wafer is performed using clean room air conditioning facilities according to claim 1, the wafer being characterized in that the silicon epitaxial wafer has a structure in which a CVD silicon oxide film is provided on a back surface of a single crystal silicon substrate and an increment of a boron concentration in a substrate single crystal silicon adjacent layer of a thickness within 0.5 μm of an interface between the CVD silicon oxide film and the substrate relative to a boron concentration in silicon of the substrate in contact with the adjacent layer is $1\times10^{15}$ atoms/cm$^3$ or less.

10. A manufacturing process for a wafer, characterized in that manufacture of the wafer is performed using clean room air conditioning facilities according to claim 1, the wafer being characterized in that the silicon wafer has a structure in which a polycrystal silicon layer is provided on one major surface of a single crystal silicon layer and a CVD silicon oxide film is further provided on the polycrystal silicon layer, and an increment of a boron concentration in a first adjacent layer of a thickness of 1 μm adjacent to and including an interface between the polycrystal silicon layer and the single crystal silicon layer relative to a boron concentration in silicon in external contact with the first adjacent layer is $1\times10^{15}$ atoms/cm$^3$ or less and an increment of a boron concentration in a polycrystal silicon adjacent layer of a thickness of 0.5 μm adjacent to and including an interface between the CVD silicon oxide film and the polycrystal silicon layer relative to a boron concentration in polycrystal silicon in external contact with the polycrystal silicon adjacent layer is $1\times10^{15}$ atoms/cm$^3$ or less.

11. A manufacturing process for a wafer, characterized in that manufacture of the wafer is performed using clean room air conditioning facilities according to claim 1, the wafer being characterized in that the silicon epitaxial wafer has a structure in which a polycrystal silicon layer is provided on a back surface of a substrate and a CVD silicon oxide film is further provided on the polycrystal silicon layer, and an increment of a boron concentration in a second adjacent layer of a thickness of 1 μm adjacent to and including an interface between the polycrystal silicon layer and a single crystal silicon layer relative to a boron concentration in silicon in external contact with the second adjacent layer is $1\times10^{15}$ atoms/cm$^3$ or less and an increment of a boron concentration in a polycrystal silicon adjacent layer of a thickness of 0.5 μm adjacent to and including an interface between the CVD silicon oxide film and the polycrystal silicon layer relative to a boron concentration in polycrystal silicon in external contact with the polycrystal silicon adjacent layer is $1\times10^{15}$ atoms/cm$^3$ or less.

* * * * *